United States Patent
Chang et al.

(10) Patent No.: US 7,869,284 B1
(45) Date of Patent: Jan. 11, 2011

(54) ERASING METHOD FOR NONVOLATILE MEMORY

(75) Inventors: Ting-Chang Chang, Taipei Hsien (TW); Fu-Yen Jian, Taipei Hsien (TW); Hung-Wei Li, Taipei Hsien (TW)

(73) Assignee: Acer Incorporated, Hsichih (TW)

( * ) Notice: Subject to any disclaimer, the term of this patent is extended or adjusted under 35 U.S.C. 154(b) by 0 days.

(21) Appl. No.: 12/498,010

(22) Filed: Jul. 6, 2009

(30) Foreign Application Priority Data

Jun. 17, 2009 (TW) .................................. 98120225

(51) Int. Cl.
*G11C 11/04* (2006.01)
(52) U.S. Cl. ................ 365/185.29; 365/185.3
(58) Field of Classification Search ............. 365/185.29
See application file for complete search history.

(56) References Cited

U.S. PATENT DOCUMENTS

| 7,075,828 | B2 * | 7/2006 | Lue et al. | 365/185.24 |
| 2003/0117855 | A1 * | 6/2003 | Lee | 365/185.29 |

* cited by examiner

*Primary Examiner*—Hoai V Ho
*Assistant Examiner*—Anthan T Tran
(74) *Attorney, Agent, or Firm*—C. G. Mersereau; Nikolai & Mersereau, P.A.

(57) ABSTRACT

The present invention relates to an erasing method for nonvolatile memory, which uses forward bias between the source/drain region and body contact to inject majority carriers into the body, and then accelerates the majority carriers by an electric field between the body and the gate to energize the majority carriers to overcome the oxide barrier and to erase the nonvolatile memory.

6 Claims, 2 Drawing Sheets

ERASING METHOD FOR NONVOLATILE MEMORY

FIELD OF THE INVENTION

The present invention relates to an erasing method for a nonvolatile memory, and in particular to an erasing method for a nonvolatile memory by using a body contact.

BACKGROUND OF THE INVENTION

As a result of the nonvolatile memory widely used in the electrical devices in recent years, requirements of the nonvolatile memory with high performance have raised, and different types of flash type nonvolatile memory have been developed such as types of floating gate, SONOS, etc. Performances of those memories are affected by manipulation methods of those memories, and the erasing method for nonvolatile memory is very critical to such purpose.

Currently, there are two main techniques about erasing method for flash type nonvolatile memory, which use Fowler-Nordheim tunneling effect and band-to-band hot hole effect. However, one of the mentioned methods, Fowler-Nordheim tunneling effect, needs great erasing voltage and erasing time. In order to decrease the erasing time and the erasing voltage, the thickness of the tunnel oxide should be decreased, but the retention of the memory will deteriorate. The other method by using band-to-band hot hole effect only injects the hot holes to the storage layer near the drain region, but causes the recombination of all electrons in the storage layer, and it will make the threshold voltage of the channel nonuniform and cause the operating characteristic degradation and reliability issues. Therefore, there are problems to be solved in the conventional erase methods for nonvolatile memory.

SUMMARY OF THE INVENTION

An objective of the present invention is to provide an erasing method for a nonvolatile memory, a flash type nonvolatile memory, which uses the forward bias between the source/drain region and the body contact to inject majority carriers (holes with N-channel) of the body contact into the body, and then accelerates the majority carriers by the electric field between the body and the gate to energize the majority carriers to overcome the oxide barrier and to erase the nonvolatile memory. The erasing time and the erasing voltage could be decreased, and the concern with the foresaid method and the thickness of the tunnel oxide is less that the thicker tunnel oxide could be used to look after both sides of the erasing characteristic and the maintainability of retention of the nonvolatile memory.

In order to achieve the foregoing objectives of the invention, an erasing method for a nonvolatile memory according to the present invention is provided, which comprises a nonvolatile memory that is a flash type nonvolatile memory including a body, a gate, a source, a drain, a storage layer formed between the gate and the body, and a heavy doped body contact formed on the bottom or sides of the body, the method includes providing a first voltage to the gate, a second voltage to the source, the third voltage to the drain and the fourth voltage to the body contact, to erase the nonvolatile memory. For instance, with N-channel, the first voltage is a negative voltage, the second and the third voltage are grounded, ant the fourth voltage is a positive voltage.

DETAILED DESCRIPTION OF THE INVENTION

The techniques employed by the present invention to achieve the foregoing objectives and the effects thereof are described hereinafter by way of examples with reference to the accompanying drawings.

Figure 1:
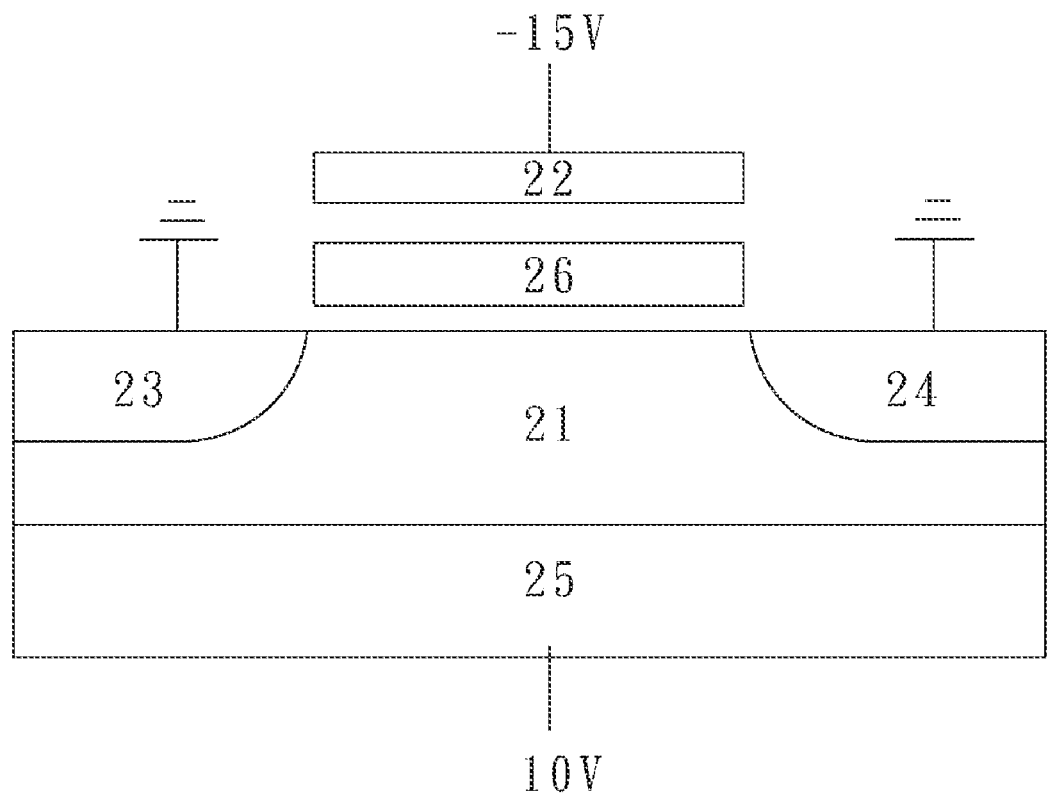
FIG. 1 is a diagram showing erasing voltages according to the first embodiment of the invention.

FIG. 1 is a diagram showing erasing voltages according to the first embodiment of the invention. Referring to FIG. 1, the present invention uses a nonvolatile memory (20) which is a flash type nonvolatile memory. For instance, with N-channel, the nonvolatile memory (20) includes a p-type body (21), a gate (22), a heavy doped N-type source (23), a heavy doped N-type drain (24), a heavy doped P-type body contact (25) formed on the bottom of the body (21) and a storage layer (26) formed between the gate (22) and the body (21), wherein the nonvolatile memory (20) could be a floating gate or a SONOS type memory. An erasing method for the nonvolatile memory according to the invention comprises providing a first voltage ranged between −12V to −15V, to the gate (22), the first voltage being −15V for instance in this embodiment; providing a second voltage, ground for instance in this embodiment, to the source (23); providing a third voltage, ground for instance in this embodiment, to the drain (24); and providing a fourth voltage ranged between 10V to 15V, to the body contact (25), the fourth voltage being 10V for instance in this embodiment. A forward bias between the drain (24)/source (23) region and the body contact (25) is used to inject majority carriers, holes in this embodiment, of the body contact (25) into the body (21), and then the electric field between the body (21) and the gate (22) accelerates the holes to generate hot holes in the body (21). The holes are energized to overcome the oxide barrier and reach the storage layer (26) to erase the nonvolatile memory (20). According to the data in this embodiment with N-channel, the erasing time takes 10 milliseconds.

Figure 2:
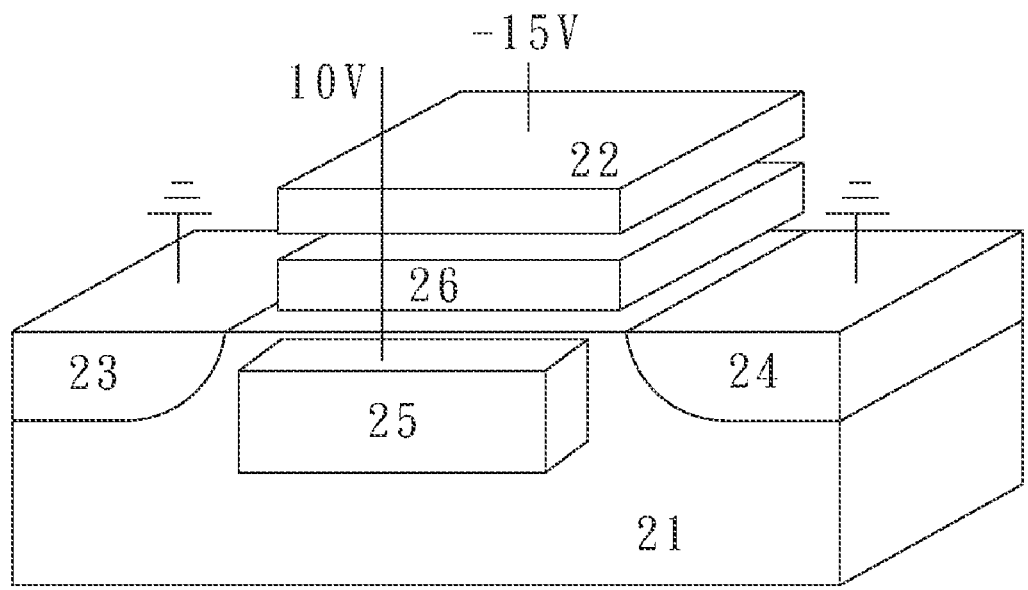
FIG. 2 is a diagram showing erasing voltages according to the second embodiment of the invention.

FIG. 2 is a diagram showing erasing voltages according to the second embodiment of the invention. An erasing method for a nonvolatile memory according to the second embodiment of the invention has the same basic steps with the erase method according to the first embodiment, so the same components of both embodiments are labeled in same number to simplify the description. The structural difference between the two methods of both said embodiments is the body contact (25) formed on a side of the body (21) of the nonvolatile memory (20) according to the second embodiment, and the erasing method according to the first embodiment can also be used in the structure of the second embodiment. Similarly, after the forward bias injects the holes to the body (21), the electric field between the body (21) and the gate (22) accelerates the holes to generate hot holes in the body (21). The holes will be energized to overcome the oxide barrier and reach the storage layer (26) to erase the nonvolatile memory (20).

The preferred embodiments of the present invention have been disclosed in the examples. However the examples should not be construed as a limitation on the actual applicable scope of the invention, and as such, all modifications and alterations without departing from the spirits of the invention and appended claims shall remain within the protected scope and claims of the invention.

What is claimed is:

1. An erasing method for a nonvolatile memory, wherein the nonvolatile memory is a flash type nonvolatile memory including a body, a gate, a source, a drain, a storage layer formed between the gate and the body, and a heavy doped body contact, the method comprising the steps of:
   (a) providing a first voltage to the gate;
   (b) providing a second voltage to the source;
   (c) providing a third voltage to the drain; and
   (d) providing a fourth voltage to the body contact,
   wherein a forward bias between the drain/source region and the body contact is used to erase the nonvolatile memory, and with N-channel, the first voltage is a negative voltage, the second and the third voltage are grounded, and the fourth voltage is a positive voltage, the forward bias between the source/drain region and the body contact injects majority carriers into the body, and the electric field between the body and the gate accelerates and energizes the majority carriers to overcome an oxide barrier and to reach the storage layer to finish erasing.

2. The erasing method for a nonvolatile memory according to claim 1, wherein the fourth voltage is provided to the body via the body contact.

3. The erasing method for a nonvolatile memory according to claim 2, wherein the body contact is formed on a bottom of the body.

4. The erasing method for a nonvolatile memory according to claim 2, wherein the body contact is formed on sides of the body.

5. The erasing method for a nonvolatile memory according to claim 1, the flash type nonvolatile memory is a floating type or a SONOS type.

6. The erasing method for a nonvolatile memory according to claim 1, wherein the flash type nonvolatile memory is with N-channel or P-channel.

* * * * *